United States Patent
Xia et al.

(10) Patent No.: US 10,580,679 B2
(45) Date of Patent: Mar. 3, 2020

(54) METHOD OF TRANSFER PRINTING AND ARTICLES MANUFACTURED THEREFROM

(71) Applicant: THE UNIVERSITY OF MASSACHUSETTS, Boston, MA (US)

(72) Inventors: Qiangfei Xia, Amherst, MA (US); Peng Lin, Amherst, MA (US)

(73) Assignee: THE UNIVERSITY OF MASSACHUSETTS, Boston, MA (US)

( * ) Notice: Subject to any disclaimer, the term of this patent is extended or adjusted under 35 U.S.C. 154(b) by 0 days.

(21) Appl. No.: 15/762,262

(22) PCT Filed: Sep. 22, 2016

(86) PCT No.: PCT/US2016/053085
§ 371 (c)(1),
(2) Date: Mar. 22, 2018

(87) PCT Pub. No.: WO2017/053550
PCT Pub. Date: Mar. 30, 2017

(65) Prior Publication Data
US 2018/0277413 A1    Sep. 27, 2018

Related U.S. Application Data

(60) Provisional application No. 62/221,675, filed on Sep. 22, 2015.

(51) Int. Cl.
*H01L 21/683* (2006.01)
*G06F 7/00* (2006.01)
(Continued)

(52) U.S. Cl.
CPC ...... *H01L 21/6835* (2013.01); *B81C 1/00373* (2013.01); *G03F 7/0035* (2013.01);
(Continued)

(58) Field of Classification Search
CPC ...... G03F 7/0035; G03F 7/2059; G03F 7/343; G03F 7/0002; G03F 7/40; H01L 21/6835;
(Continued)

(56) References Cited

U.S. PATENT DOCUMENTS

| | | |
|---|---|---|
| 8,637,346 B1 | 1/2014 | Jung et al. |
| 2014/0087191 A1 | 3/2014 | Chua et al. |
| 2017/0139257 A1* | 5/2017 | An ............ C23C 14/042 |

OTHER PUBLICATIONS

International Search Report for International Application No. PCT/US2016/53085; International Filing Date Sep. 22, 2016; dated Dec. 19, 2016, 11 pages.
(Continued)

*Primary Examiner* — Sonya M Sengupta
(74) *Attorney, Agent, or Firm* — Cantor Colburn LLP

(57) ABSTRACT

Disclosed herein is a method comprising disposing on a first substrate a two-dimensional exfoliatable material; patterning an exfoliatable material using a photoresist in a manner such that a portion of the photoresist remains in contact with the two-dimensional exfoliatable material after the patterning; disposing a polymer layer on the two-dimensional exfoliatable material to form a printing block; contacting a substrate with the printing block; and removing the polymer layer and the photoresist from the printing block to leave behind the patterned exfoliatable material on the substrate.

11 Claims, 10 Drawing Sheets

(51) Int. Cl.

| | | |
|---|---|---|
| *G03F 7/34* | (2006.01) | |
| *B81C 1/00* | (2006.01) | |
| *G03F 7/40* | (2006.01) | |
| *G03F 7/20* | (2006.01) | |
| *B82Y 40/00* | (2011.01) | |
| *H01L 23/58* | (2006.01) | |
| *C23C 14/34* | (2006.01) | |
| *C23C 14/04* | (2006.01) | |
| *C23C 14/08* | (2006.01) | |
| *G03F 7/00* | (2006.01) | |

(52) U.S. Cl.
CPC ............ *G03F 7/2059* (2013.01); *G03F 7/343* (2013.01); *G03F 7/40* (2013.01); *B82Y 40/00* (2013.01); *C23C 14/042* (2013.01); *C23C 14/086* (2013.01); *C23C 14/34* (2013.01); *G02F 2201/123* (2013.01); *G03F 7/0002* (2013.01); *H01L 23/585* (2013.01); *H01L 2221/68363* (2013.01)

(58) Field of Classification Search
CPC ......... H01L 2221/68363; H01L 23/585; B81C 1/00373; B82Y 40/00; C23C 14/042; C23C 14/0605; C23C 14/086; C23C 14/34; G02F 1/134309; G02F 1/13439; G02F 2201/123
USPC .................................................. 156/242, 247
See application file for complete search history.

(56) References Cited

OTHER PUBLICATIONS

Wang et al.; "Printing of sub-20nm wide graphene ribbon arrays using nanoimprinted graphite stamps and electrostatic force assisted bonding"; Nanotechnology 22; 2011, pp. 1-6.
Written Opinion for International Application No. PCT/US2016/53085; International Filing Date Sep. 22, 2016; dated Dec. 19, 2016, 4 pages.

* cited by examiner

Casting transfer polymer

Release

Isolated

Overlapped (not necessarily same material), such MoS2 - graphene

Stacked

Or combinations of them ized exfoliatable material on the
METHOD OF TRANSFER PRINTING AND ARTICLES MANUFACTURED THEREFROM

CROSS-REFERENCE TO RELATED APPLICATIONS

This application is a National Stage application of PCT/US2016/053085, filed Sep. 22, 2016, which claims the benefit of U.S. Provisional Application No. 62/221,675, filed Sep. 22, 2015, both of which are incorporated by reference in their entirety herein.

STATEMENT REGARDING FEDERALLY SPONSORED RESEARCH OR SUPPORT

The United States Government has rights in this invention pursuant to a grant having Grant No. FA9550-12-1-0038 from the US Air Force Office of Scientific Research.

BACKGROUND

Disclosed herein is a method of transfer printing and articles manufactured therefrom. In particular, disclosed herein is a method of transfer printing using two-dimensional exfoliatable materials and articles manufactured therefrom.

State-of-the-art computers based on CMOS (complementary metal-oxide-semiconductors) hardware and Boolean algorithms are approaching their physical and economic limits. Power efficiency, computing speed and scaling limits inhibit further development of a pure CMOS-based platform. In the post-CMOS era, it is desirable to develop new devices, disruptive technology, alternative architecture and novel materials for the future computing devices and systems. During the past decade, graphene has emerged as one of the leading contenders for use as a fundamental building block for the next generation of nanoelectronic devices, albeit without an energy bandgap in its blank thin film format. Other types of two-dimensional (2D) materials such as transition metal dichalcogenide (TMD) which possesses a decent bandgap were then developed. More recently, the rediscovered black phosphorus (BP) also joined the 2D materials family as the newest member.

There have been a tremendous amount of research and development in 2D materials and their applications to electronic and optical devices, enabled by fundamental research such as materials synthesis, device fabrication and bandgap engineering. Despite the achievements and improvements in these areas, control over the thickness of 2D flakes is lacking. This lack of control may be best described as the "thickness vs cross-sectional surface area dilemma". Large flakes (having surface areas greater than 10,000 square nanometers) turn out to be thicker and less functional while thin flakes (having surface areas less than 10,000 square nanometers) are usually too small to be used in electrical circuits. The lack of systematic study on the device physics as a function of the thickness is because no viable technology is available to provide well controlled flake thickness. On the other hand, in order to adopt novel 2D material-based devices into wider applications, it is useful to develop technology that can manufacture arrays of devices over large areas with high performance uniformity. The manufacturability of the reproducible 2D devices is important for the future development of this area as well. It is also useful to be able to integrate the 2D material-based devices with existing systems infrastructure such as optical fibers and CMOS circuits, to further expand the functionality with the hybrid circuits/systems.

SUMMARY

Disclosed herein is a method comprising disposing on a first substrate a two-dimensional exfoliatable material; patterning an exfoliatable material using a photoresist in a manner such that a portion of the photoresist remains in contact with the two-dimensional exfoliatable material after the patterning; disposing a polymer layer on the two-dimensional exfoliatable material to form a printing block; contacting a substrate with the printing block; and removing the polymer layer and the photoresist from the printing block to leave behind the patterned exfoliatable material on the substrate.

Disclosed herein too is an article comprising a patterned exfoliatable material; wherein the patterned two-dimensional exfoliatable material is obtained by a method comprising patterning an exfoliatable material using a photoresist in a manner such that a portion of the photoresist remains in contact with the two-dimensional exfoliatable material after the patterning; disposing a polymer layer on the two-dimensional exfoliatable material to form a printing block; contacting a substrate with the printing block; and removing the polymer layer and the photoresist from the printing block to leave behind the patterned exfoliatable material on the substrate.

DETAILED DESCRIPTION

Figure 1A:
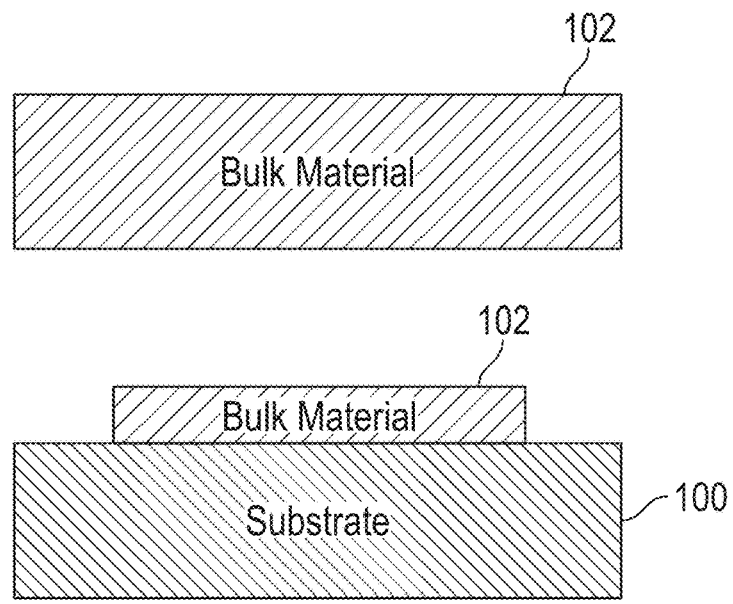
FIG. 1A is a depiction of the disclosed method that includes two types of exfoliatable materials.

Disclosed herein is a method that comprises printing or molding using exfoliatable two-dimensional (2D) materials.

Examples of exfoliatable materials are layered materials such as graphene, highly ordered pyrolytic graphite (HOPG), molybdenum disulfide (MoS2), black phosphorus, rhenium disulfide (ReS2), and the like. Each of these exfoliatable materials have a plurality of layers that are disposed parallel to one another. These parallel layers can be separated using the method disclosed herein and each layer that is disposed on a substrate can be used in a device. In an embodiment, the device is an electrical device such as, for example, a semiconductor.

The method comprises printing with high precision on a substrate using a single or few atomic or molecular layers of these exfoliatable materials. The method is based on the dry etching and the interface chemistry of a transfer mold and the 2D materials. The exfoliation/transfer printing can be repeated and hence can cover a large surface area of a substrate of a variety of different materials. This technology allows for the assembling of novel devices based on 2D heterostructures, and enables the large area fabrication of electronic and photonic devices with designed properties. In one embodiment, the method may be used to manufacture semiconductors.

The method comprises disposing a stack of 2D exfoliatable material layers on a first substrate and patterning the stack (also referred to sometimes as a block) of 2D exfoliatable material layers to texture it. The textured stack after the patterning is then pressed against a second substrate and transfers to the substrate at least one layer of the 2D exfoliatable material layers with each contact between the stack and the substrate. In an embodiment, the stack of 2D exfoliatable material is mounted on a scaffold after being disposed on the first substrate, which provides the stack with support and stability. The scaffold generally comprises one or more layers of a polymeric material but can also be manufactured from a ceramic material or a metal. In an embodiment, the scaffold can comprise one or more polymeric materials that also serve as photoresists. The polymeric materials are first used as resists and at the same time encapsulate the stack to provide it with support and stability for further processing.

The 2D exfoliatable material does not always have to be disposed on a first substrate. A block of the material that is not disposed on the first substrate can also be patterned and brought into contact with the second substrate to transfer at least one layer of the block (stack) onto the second substrate. The 2D exfoliatable material is generally disposed in or on the first substrate if it is not a material that has a substantially flat surface.

As noted above, the 2D exfoliatable material is first disposed on a substrate (the first substrate) and patterned using a photoresist or using a plurality of photoresists. Etching such as plasma etch may be used to pattern the 2D exfoliatable material with the photoresist disposed thereon. A portion of the photoresist remains on the 2D exfoliatable material after the etching. A first polymer layer is then disposed on 2D exfoliatable material (having the photoresist disposed thereon) to form a printing block. The printing block is then used to make a print of the 2D exfoliatable material on the second substrate. After printing the second substrate, the polymer layer may optionally be removed by dissolution or by abrasion. The remaining photoresist that is disposed on the 2D exfoliatable material is then removed by dissolution, degradation, and the like. The 2D exfoliatable material that is now present on the second substrate may be used in the manufacturing of a suitable device for commercial use.

In an embodiment, several layers from the 2D exfoliatable material may be disposed one atop the other to create a 3D structure on the second substrate.

FIG. 1(A) is a depiction of the disclosed method that includes two types of exfoliatable materials. These involve exfoliatable materials that have large flat surfaces and that can be used in the bulk without the use of the substrate (also called the first substrate). Those exfoliatable materials that do not have large flat surfaces are disposed in or on the first substrate in order to provide them with the appropriate support to facilitate further processing. The method comprises disposing flakes of a 2-dimensional exfoliatable material 102 on a first substrate 100 such that their (the flakes) largest faces are parallel to the surface of the substrate. While 2D exfoliatable materials that do not have substantially flat surfaces are disposed on the first substrate, other bulk materials do not need to be disposed on a substrate and may be directly patterned. The exfoliatable materials may be pure materials (i.e., they are not intercalated) or may be intercalated with other suitable materials. Suitable examples of exfoliatable materials are graphene, graphite, graphite intercalation compounds, highly oriented pyrolytic graphite, molybdenum disulfide (MoS2), clays, black phosphorus (BP), hexagonal boron nitride (h-BN), tungsten diselenide (WSe2), rhenium disulfide, or the like, or a combination thereof. The substrate 100 can be a metal, a ceramic, a polymer, or a combination thereof. Suitable substrates are semiconductor substrates such as silicon substrates or silica substrates.

The flakes generally have cross-sectional areas (measured parallel to the surface of the substrate) of up to 5000 micrometers×5000 micrometers (i.e., 25×10$^6$ square micrometers), preferably 1000 micrometers×1000 micrometers, preferably up to 500 micrometers×500 micrometers and more preferably up to 100 micrometers×100 micrometers and have thicknesses of up to 100 nanometers, preferably up to 80 nanometers and more preferably up to 40 nanometers. The cross sectional area is no less than 100 square nanometers (i.e., 10 nanometers×10 nanometers). The flakes can have a thickness of 1 nanometer or greater, preferably 5 nanometers or greater and preferably 10 nanometers or greater up to a thickness of 2 centimeters. In an embodiment, the flakes should have more layers than the desired final number of exfoliation layers, preferably greater than or equal to 1 layer, preferably greater than or equal to 10 layers, and more preferably greater than or equal to 100 layers.

Figure 1B:
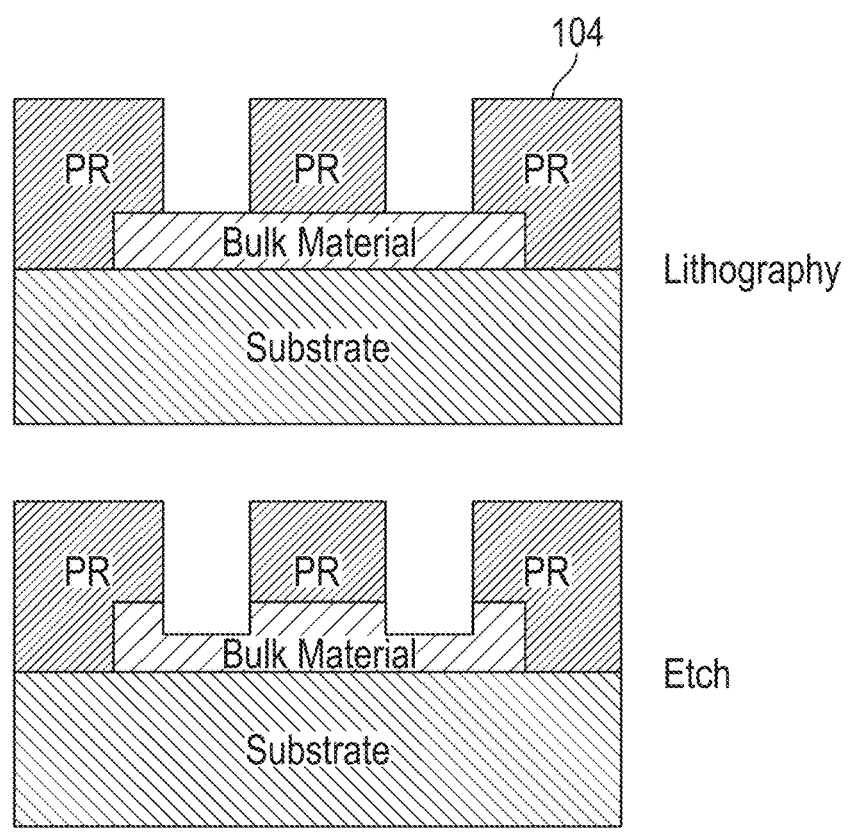
FIG. 1(B) shows the patterning of the exfoliatable material using a photoresist (PR) followed by etching.
Figure 1C:
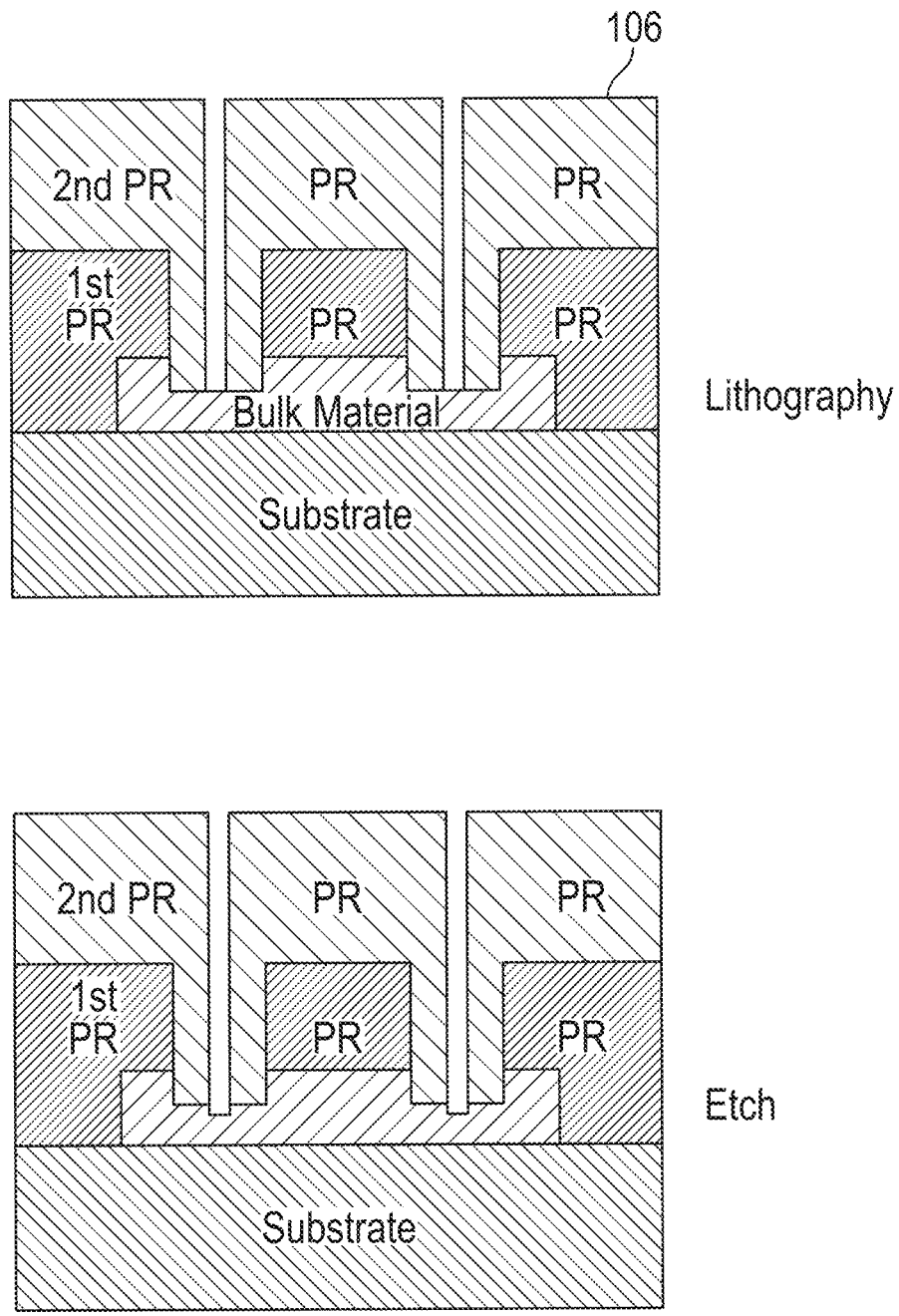
FIG. 1(C) also shows the patterning of the exfoliatable material with an optional second photoresist (2nd PR) followed by etching.

In an exemplary embodiment, a relatively large flake of the 2D exfoliatable material 102 is transferred from bulk and disposed on a flat first substrate 100 (such as a silica/silicon wafer) primarily by using a traditional Scotch tape method. The large faces of the flake 102 are parallel to the surface of the first substrate 100. The purpose of this step is to provide a starting material that is flat enough for further processing. This is shown in FIGS. 1(B) and 1(C). For materials that have a relatively flat surface in the bulk state, such as for highly ordered pyrolytic graphite (HOPG) this step may be avoided if desired.

The flake 102 that is disposed on the substrate may then be patterned using lithography. A variety of different types of lithographies may be used to pattern the flake 102 that is disposed on the substrate. For example, photolithography may be used to pattern the flake 102. The incident radiation used in the lithography can be electron beam, proton beam, ion beam, ultraviolet (UV), infrared (IR), X-ray, or other high-energy radiation. In an embodiment, electron beam lithography is preferred.

Depending on the exfoliation condition, the patterning via lithography may include the use of photoresists to impart a desired shape to the 2D exfoliatable flake. In an embodiment, the photoresist may include a single layer photoresist or a multiple layer photoresist. In an embodiment, a multiple layer photoresist such as a double layer photoresist may be used.

In an embodiment, the photoresist is manufactured from a polymer that can be molded onto the 2D exfoliatable material, or alternatively, can be disposed on the 2D exfoliatable material and cured to form the scaffold. When the polymer is subjected to curing, it is generally disposed on the 2D exfoliatable material in the form of a low molecular weight compound and then cured using either thermal energy or radiation. These low molecular weight compounds (referred to herein after as precursors) are generally monomers, dimers, trimers, quadramers, pentamers or oligomers that upon undergoing curing become high molecular weight polymers. They are crosslinked upon undergoing a reaction. Both positive and negative tone photoresists can be used. In the present case, polymethylmethacrylate serves as a positive tone resist that undergoes reversed "chain breaking process" (an unzipping of the polymer) upon exposure to a degradation process.

Polymers that can be used as photoresists (or alternatively just as resists) are either thermoplastics, thermosets or combinations thereof. In an embodiment, the photoresist is a multilayered combination of the thermoset and a thermoplastic polymer.

Examples of the organic polymers are polyacetals, polyolefins, polyacrylics, polycarbonates, polystyrenes, polyesters, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, styrene acrylonitrile, acrylonitrile-butadienestyrene (ABS), polyethylene terephthalate, polybutylene terephthalate, polyurethane, ethylene propylene diene rubber (EPR), polytetrafluoroethylene, perfluoroelastomers, fluorinated ethylene propylene, perfluoroalkoxyethylene, polychlorotrifluoroethylene, polyvinylidene fluoride, polysiloxanes, or the like, or a combination comprising at least one of the foregoing organic polymers. An exemplary thermoplastic polymer is a polymethylmethacrylate.

The thermoplastic polymer may be disposed on the first substrate by injection molding, compression molding, vacuum forming, spin casting, spray painting, brush painting, coating using a doctor blade, or the like, or a combination thereof. In an exemplary embodiment, the thermoplastic polymer is polymethylmethacrylate.

Examples of thermosetting polymers suitable for use in the polymeric composition include epoxy polymers, polyacrylates, polymethacrylates, unsaturated polyester polymers, polyimide polymers, bismaleimide polymers, bismaleimide triazine polymers, cyanate ester polymers, vinyl polymers, benzoxazine polymers, benzocyclobutene polymers, acrylics, alkyds, phenol-formaldehyde polymers, novolacs, resoles, melamine-formaldehyde polymers, ureaformaldehyde polymers, hydroxymethylfurans, isocyanates, diallyl phthalate, triallyl cyanurate, triallyl isocyanurate, unsaturated polyesterimides, polysiloxanes, a silane, or the like, or a combination comprising at least one of the foregoing thermosetting polymers. An exemplary thermosetting polymer is a polymethylmethacrylate. The thermosetting precursor is generally disposed on the substrate and on the 2D exfoliatable material using techniques such as spin casting, spray painting, brush painting, coating using a doctor blade, or the like, or a combination thereof.

In an exemplary embodiment, with reference to the FIG. 1(B), a first photoresist layer 104 comprising polymethylmethacrylate (PMMA) or polypropylene carbonate (PPC) is disposed on the substrate 100 by spin coating to encapsulate the 2D exfoliatable material 102. The first photoresist layer 104 has a thickness of 100 to 2000 nanometers, preferably 150 to 500 nanometers and more preferably 200 to 400 nanometers.

An optional second photoresist layer 106 is then disposed on the first photoresist layer 104. The second photoresist layer 106 may also be disposed by spin coating and has a thickness of 100 to 2000 nanometers, preferably 150 to 500 nanometers and more preferably 200 to 400 nanometers.

In an embodiment, the first photoresist layer 104 is the same as the second photoresist layer 106. In another embodiment, the first photoresist layer 104 is different from the second photoresist layer 106. As stated above, the photoresist layers 104 and 106 can serve to stabilize and strengthen the exfoliatable material from bending or forming wrinkles, and to promote the adhesion of the 2D pattern in the transfer block. In addition, layers 104 and 106 both function to serve as etch masks. Layers 104 used as mask to etch n−1 layers in the 2D exfoliatable material (where n is the total number of layers) and layer 106 may be used to etch a single layer. The second PR may be disposed to facilitate two-step etching for better thickness control.

A transfer window is then developed by adding a transfer polymer 110 (this is discussed in detail later) on the spin coated photoresists (the first and the second photoresist layers 104 and 106 respectively) using electron beam lithography. During the electron beam lithography desired patterns may be created in the photoresists.

Only the boundaries of the patterns are exposed and developed. The resist disposed on top of the designed patterns are kept as etching and transfer masks while the resist outside the transferring window are served as anchors to hold the bulk 2D exfoliatable material flakes. The patterns may be further developed by exposure to a solvent to remove portions of the polymer that are dissolvable (i.e., some of the portions that were not crosslinked by the electron-beam lithography).

Exemplary solvents that may be used with the photoresists are water, alcohols such as methanol, ethanol, and the like, acetonitrile, butyrolactone, propylene carbonate, ethylene carbonate, ethylene glycol, diglyme, triglyme, tetraglyme, nitromethane, nitrobenzene, benzonitrile, methylene chloride, chloroform, ketones such as acetone, methylisobutylketone, or the like, or a combination thereof. An exemplary solvent when the photoresist(s) comprises polymethylmethacrylate is methylisobutylketone.

Following the formation of the photoresist, the 2D exfoliatable material is etched as shown in the FIG. 1(C). The optional second photoresist may be disposed on the first photoresist prior after the etching of the exfoliatable material (e.g., the flake). Various types of etching may be used such as ion etching, chemical etching, reactive ion etching (RIE), or the like, or combinations thereof. During the etching process, the first photoresist layer 104 and the second photoresist layer 106 are used as masks and with an optimized RIE recipe, the exposed part on the flake will be etched to a desired depth.

For the reactive ion etch (also sometimes referred to as sputter/ion milling), an argon plasma etch which is an ion bombardment (also known as a sputtering process) may be used. The novelties of the method are as follows. The active device area is protected and is never attacked by the etchant. This facilitates preservation of material quality.

The method permits the formation of large patterns even in cases where the exfoliatable material has only a few exfoliatable atomic layers. In general, when other comparative methods are used, the larger the flake is, the thicker it will be. This prevents the method from being easily used and renders the method less versatile. In other words, comparative methods make it difficult to get large patterns with exfoliatable materials that have a few atomic layers. The method disclosed herein ensures the complete release of the defined patterns with desired thickness and shape and is possible to create a pattern/array with a large surface area. The method can be used with exfoliatable materials that have 1 to 20, preferably 2 to 10 and more preferably 3 to 9 atomic or molecular layers.

Figure 1D:
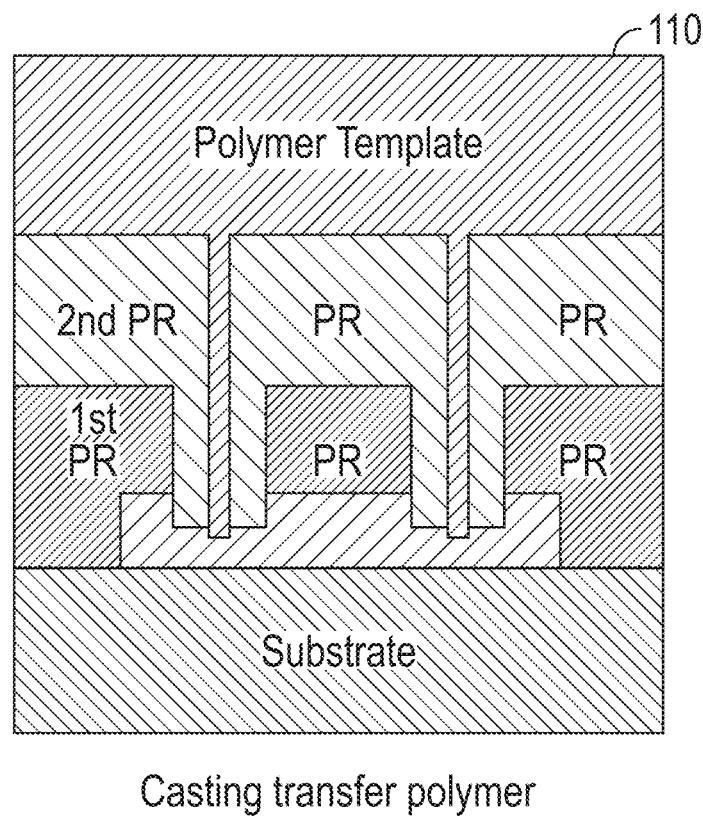
FIG. 1(D) depicts the disposing of a polymer layer on the etched sample to facilitate the removal of the bulk 2D exfoliatable material flake from the substrate.
Figure 1D:
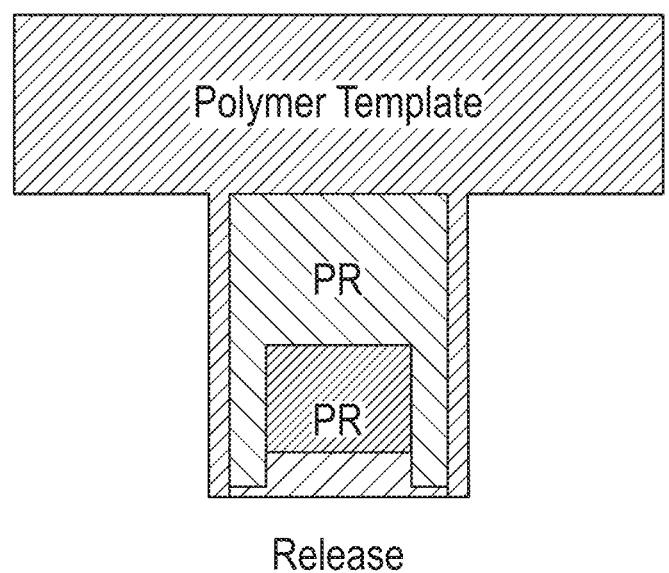

A layer of polymer 110 is then disposed onto the etched sample as shown in the FIG. 1(D) to facilitate the removal of the bulk 2D exfoliatable material flake 102 from the substrate 100. The layer of polymer 110 is referred to as a transfer polymer.

Figure 1E:
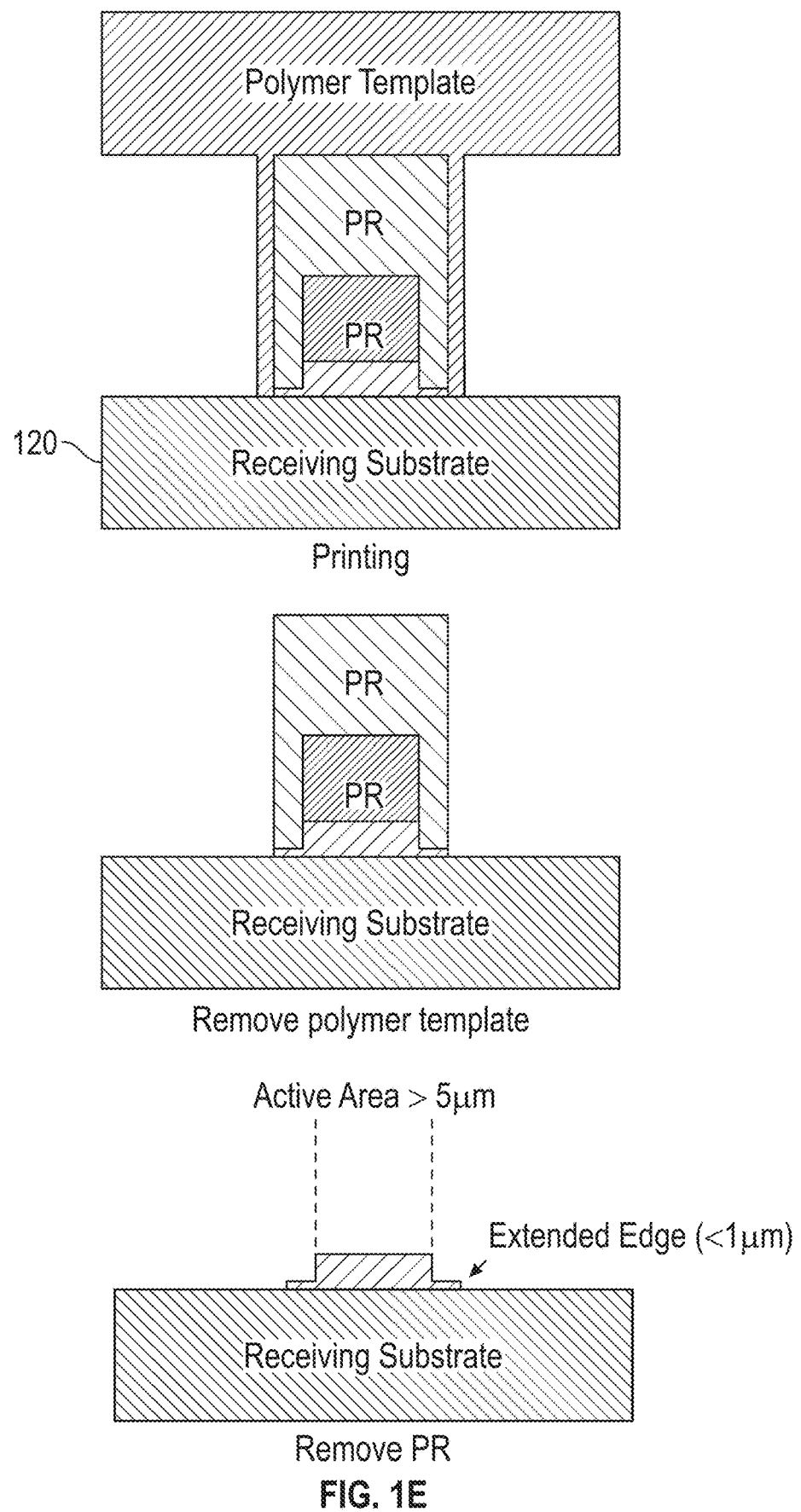
FIG. 1(E) depicts the disposing of the patterned 2D exfoliated material against the target substrate (also called a second substrate) and the printing of the exfoliatable material on the second substrate.

In the FIG. 1(E), the exfoliatable material (e.g., the flake) with the photoresists and the polymer layer 110 disposed thereon are disposed on to a second receiving substrate 120. The layer of polymer 110 together with the squares of the bulk 2D exfoliatable material flake 102 and the first and second photoresist layers 104 and 106 will henceforth be referred to as a "printing block" 112 (See FIG. 1(E)).

The layer of polymer 110 may be a thermoplastic or thermosetting polymer and may be selected from the aforementioned lists. The polymer may be disposed on the substrate (to encapsulate the etched 2D exfoliated materials and the photoresists) by one of the aforementioned methods. Following the disposing of the polymer it may be baked at an elevated temperature to remove any solvents present.

In an embodiment, the layer of polymer 110 is polyvinylalcohol and it is disposed on the substrate using spin casting. The elevated temperature for removing solvents is dependent upon the type of polymers (i.e., their glass transition temperatures, melting temperatures, curing temperatures, or the like) used in the printing block and may be 60 to 350° C., preferably 80 to 200° C. In an exemplary embodiment, the elevated temperature for removing solvents is between 85 to 100° C.

Figure 1F:
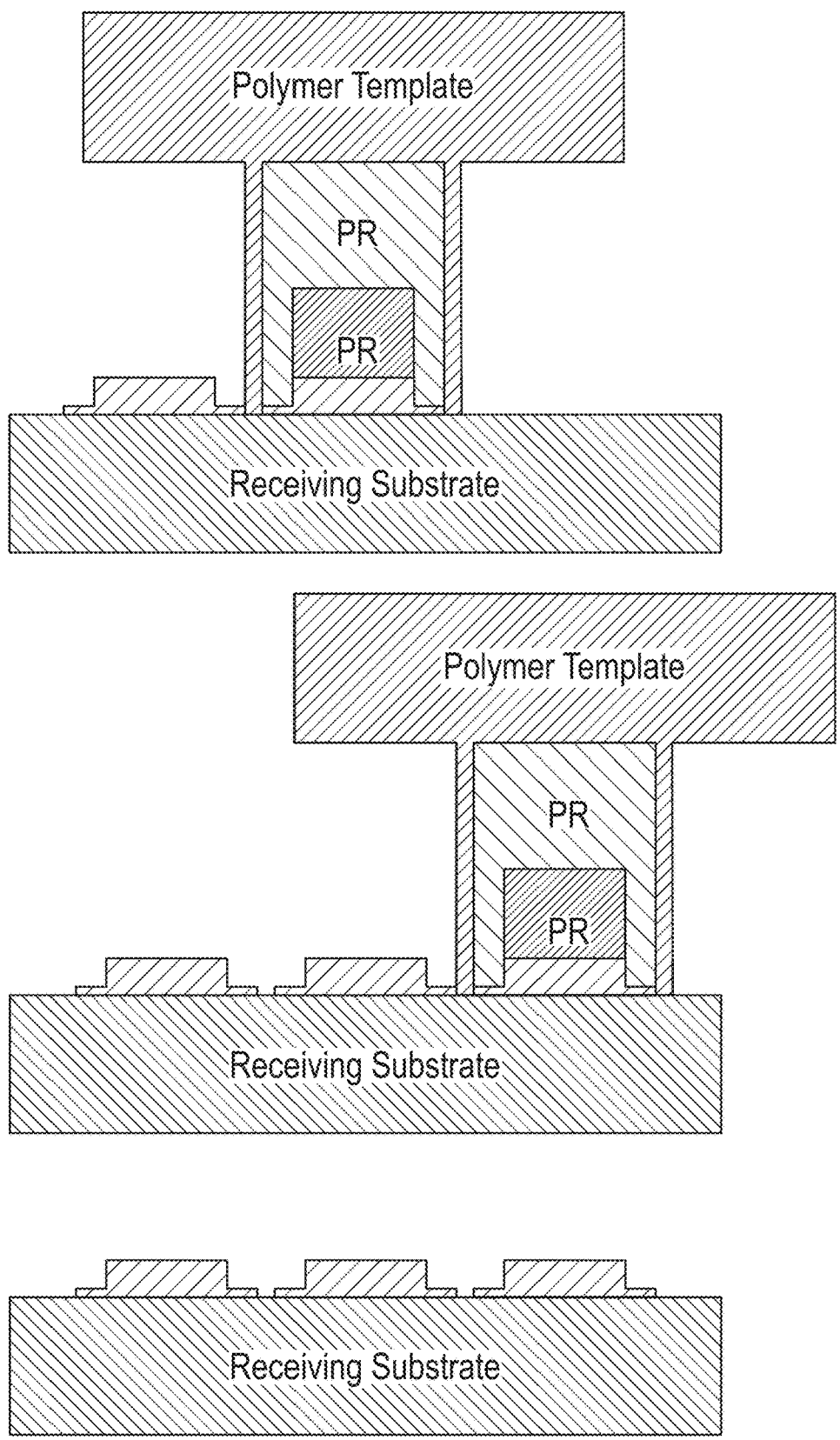
FIG. 1(F) depicts the repeated printing of the exfoliatable material on the second substrate (the target substrate)
Figure 1G:
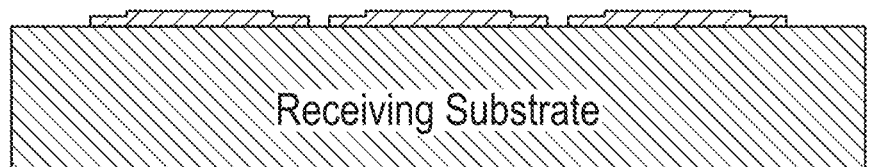
FIG. 1(G) depicts various configurations of the target substrate with the exfoliatable material disposed thereon. The target substrate can then be used to print another surface or to mold a device.
Figure 1G:
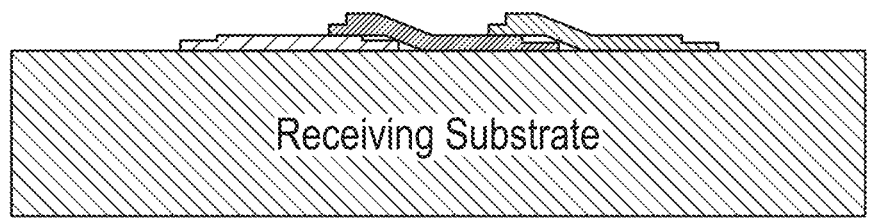
Figure 1G:
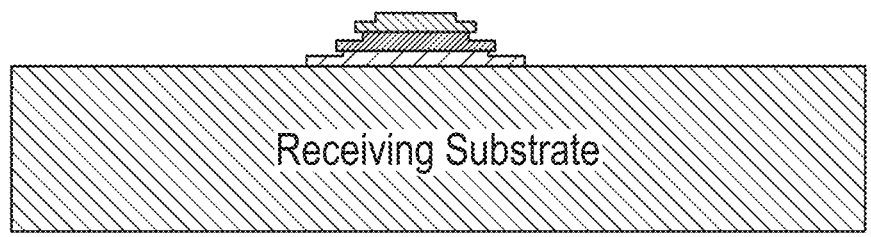

The printing block with the patterned 2D exfoliated material is then printed against the target substrate (hereinafter a second substrate 120) as shown in the FIG. 1(E) and is briefly baked to an elevated temperature to achieve better contact to the second substrate 120. The elevated temperature for establishing better contact with the second substrate is again dependent upon material properties and is from 75 to 350° C., preferably 85 to 210° C., preferably 90 to 110° C. One or more printing blocks may be used to repeatedly print the same pattern or a variety of patterns on the substrate 120. This is shown in the FIGS. 1(F) and 1(G).

In an alternative embodiment, the layer of polymer 110 from the printing block may then be removed by dissolving the polymer in a suitable solvent. A list of suitable solvents is provided above. When polyvinyl alcohol is used in the "printing block" it is removed by dissolving the printing block in hot water at a temperature of between 65 to 95° C. for 2 to 20 minutes. After the removal of the polymer layer by the solvent the 2D exfoliatable material flake patterns are protected by the thick photoresist mask and will not be attacked by the solvent. In the case of the "printing block" that contains polyvinyl alcohol, the removal of the polyvinylalcohol by water does not damage the 2D exfoliatable material because it is protected by the thick layer of PMMA (the first and the second photoresist).

The printing block now devoid of the polymer layer is subjected to a dissolution or degradation process to remove the photoresists as shown in the FIG. 1(E). The degradation of the photoresist layer may be brought about by chemical degradation, thermal degradation, mechanical degradation, degradation by radiation, or the like, or combinations thereof. Chemical degradation may involve dissolution. In the case of the exemplary printing block that contains the layer of polyvinylalcohol, the PMMA photoresists are removed by treating it in either in hot acetone bath or by a short e-beam exposure followed by developing in solvent solution that comprises methylisobutylketone and isopropanol. The 2D exfoliatable flakes (on the second substrate) of a controlled thickness (now devoid of any polymeric material coating) are now ready to use in specific applications or devices. These exfoliatable and printed 2D flakes having well-defined lateral dimensions and thicknesses and may be used for device fabrication.

There are several advantages of the approach in the proposed exfoliation and transfer printing. First, the 2D exfoliatable material disposed on the second substrate will have a defined area and thickness, which is useful for achieving desired and controlled properties in any manufactured device. The excellent electronic properties imparted to the device by the bulk 2D materials are not compromised in the process. The method is cost effective. The printing process can be repeated and large area can be covered by this technique in a 'step and repeat' fashion. It is desirable to achieve a heterostructure that combines different 2D exfoliatable materials to use in applications, such as, field-effect transistors built with MoS2 channel, graphene electrodes and hexagonal boron nitride gate dielectric layer.

The invention is exemplified by the following non-limiting example.

Example

In this example, a thick flake having a cross-sectional size greater than 100 nanometer was used to develop a printing block. This example demonstrates the transfer printing method for large area integration. The thickness of the 2D exfoliatable materials (flakes) scales inversely with the surface area of the flake. The ideal thickness for most of 2D materials is in sub-10 nm region, which limits the flake size.

Figure 2:
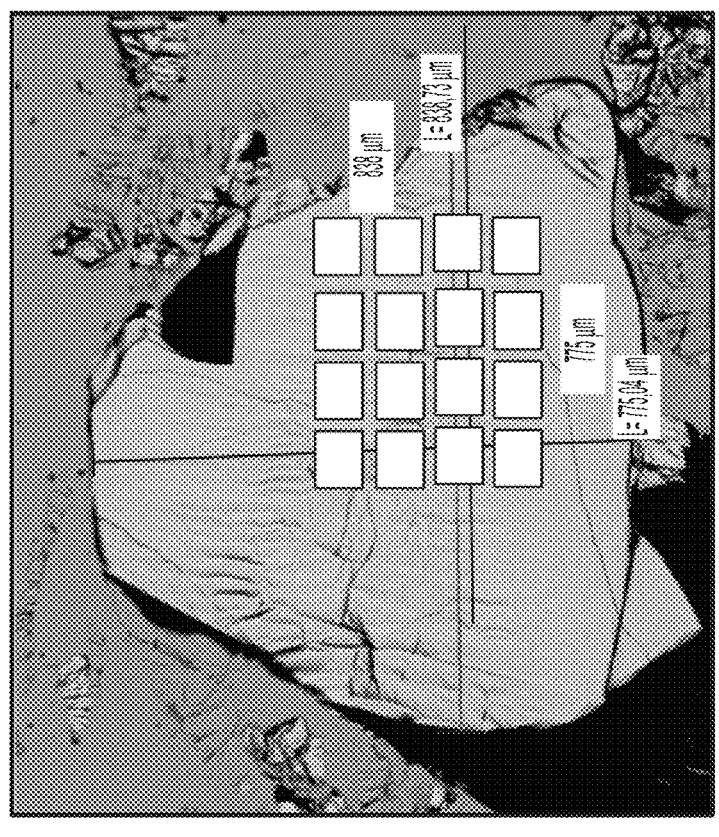
FIG. 2 depicts the patterning of a flake of an exfoliatable material that has a cross-sectional dimension greater than 100 nanometers.
Figure 2:
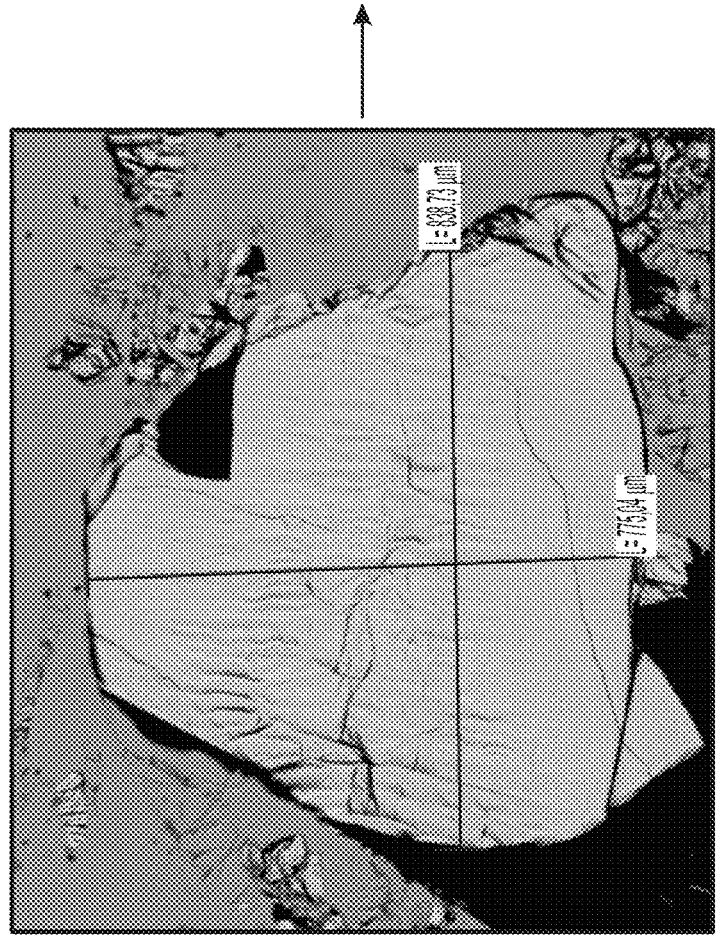

The FIG. 2 depicts the patterning of a flake of an exfoliatable material that has a cross-sectional dimension greater than 100 nanometers. The width (measured in the horizontal direction) of the flake is greater than 800 micrometers. As seen in the FIG. 2, the flake is etched to a desired depth/thickness (see the series of squares in the flake).

Figure 3:
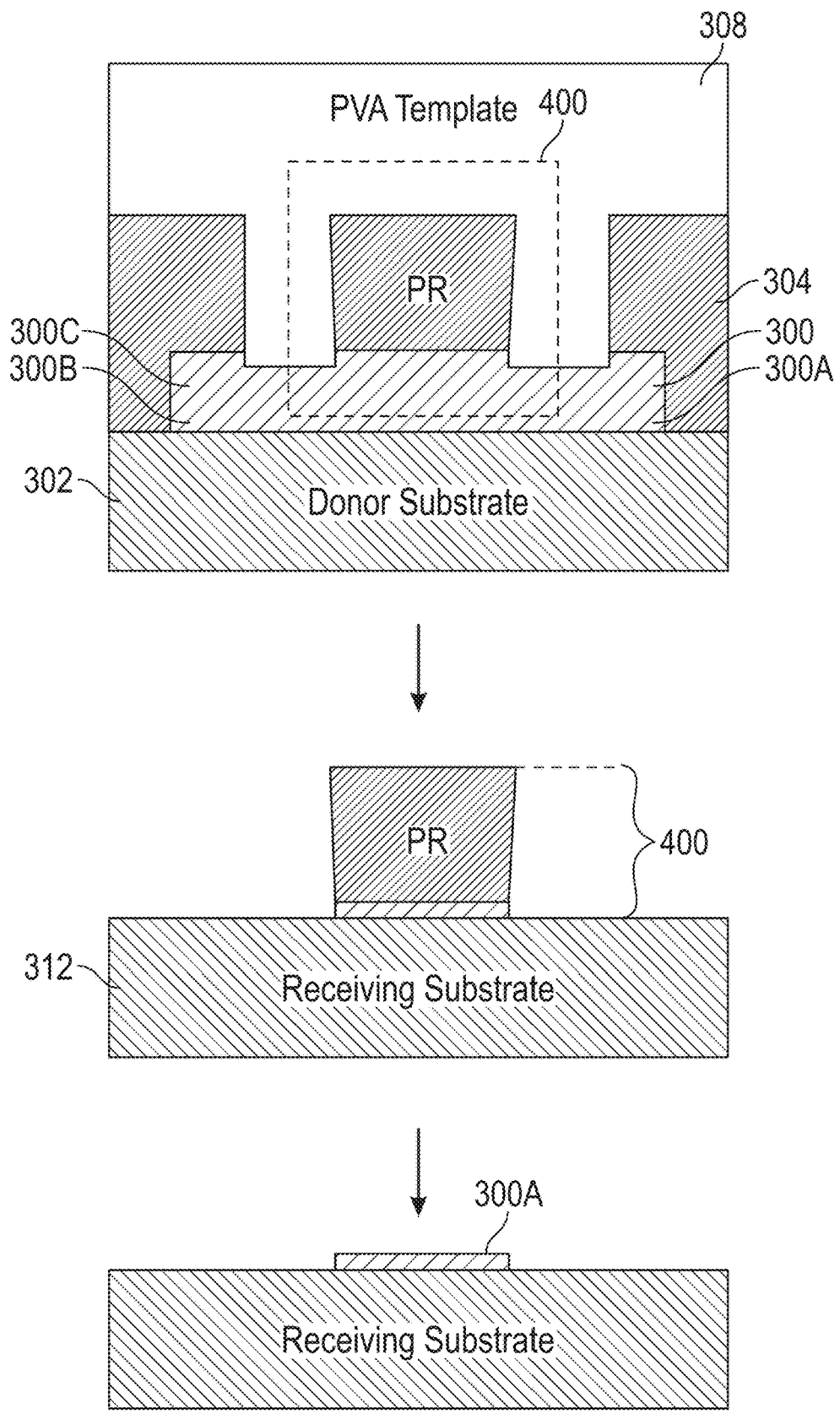
FIG. 3 depicts a schematic diagram of manufacturing a printing block using an exfoliatable material using black phosphorus.

The FIG. 3 depicts one method of manufacturing the printing block. The flake 300 comprising a plurality of exfoliatable layers (300A, 300B, 300C, and so on) is disposed on a first substrate 302. The flake is then etched using a photoresist 304 that comprises polypropylene carbonate (PPC) and polymethylmethacrylate (PMMA). A transfer polymer layer 308 that comprises polyvinylalcohol is disposed on the photoresist 304.

The polyvinylalcohol transfer polymer layer 308 is then degraded to form the printing block 400. The printing block 400 is then used to deposit separate layers of the exfoliatable material 300A on the second substrate 312.

Figure 4:
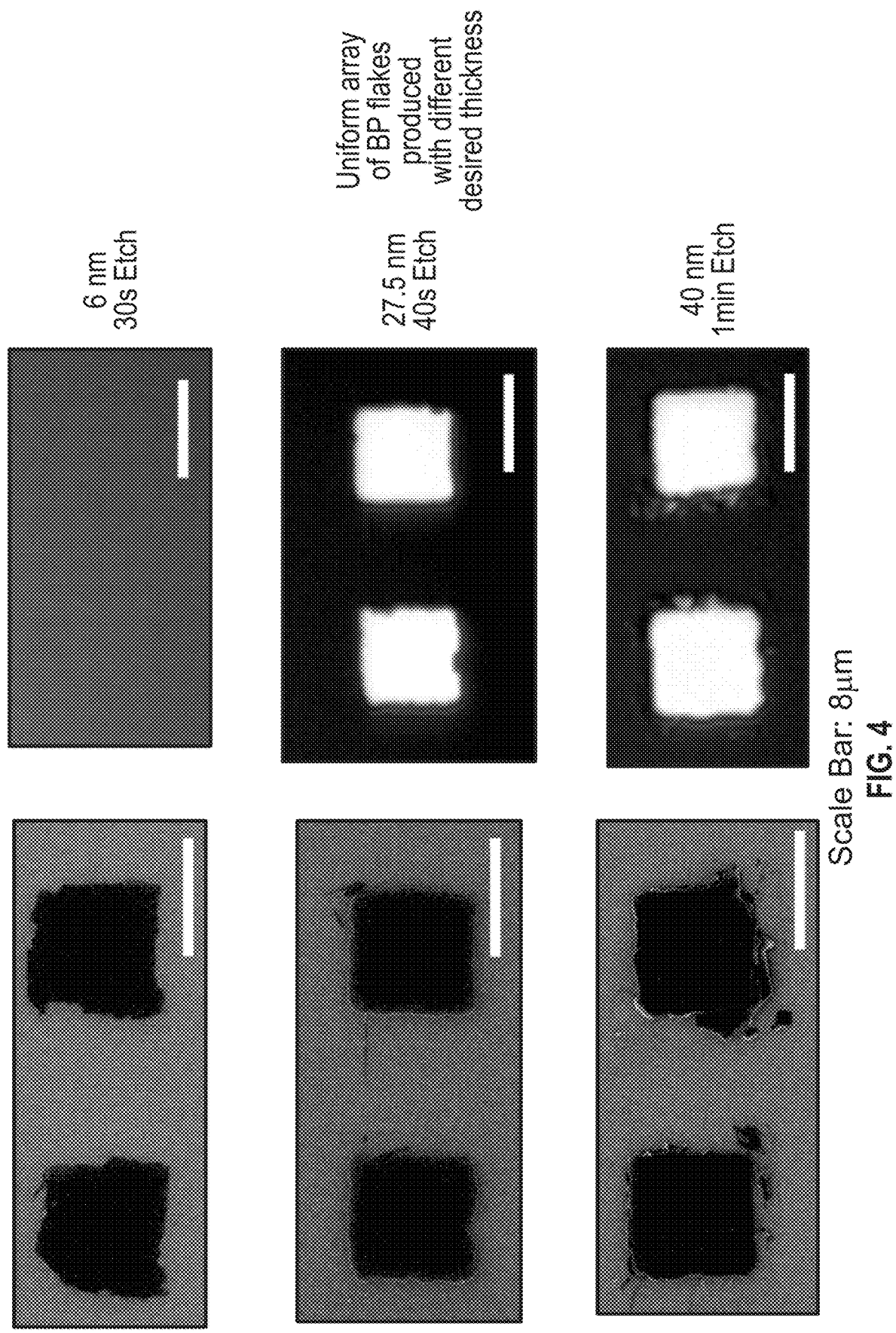
FIG. 4 depicts a series of photomicrographs that depict a uniform array of black phosphorus flakes produced with different desired thickness.

The FIG. 4 depicts the printing of the second substrate with a 2D exfoliatable material that comprises black phosphorus. As may be seen in the photomicrographs of the FIG. 4, the etch time was varied from 30 seconds to 1 minute and with the increase in exposure time, larger amounts of the black phosphorus layer were exposed. At 30 seconds of exposure, the thickness of the exposed flake was 6 nanometers, while at 1 minute of exposure, the thickness of the exposed flake was 40 nanometers. From the FIG. 4 it may be seen that a uniform array of black phosphorus flakes are produced with different desired thickness.

Figure 5A:
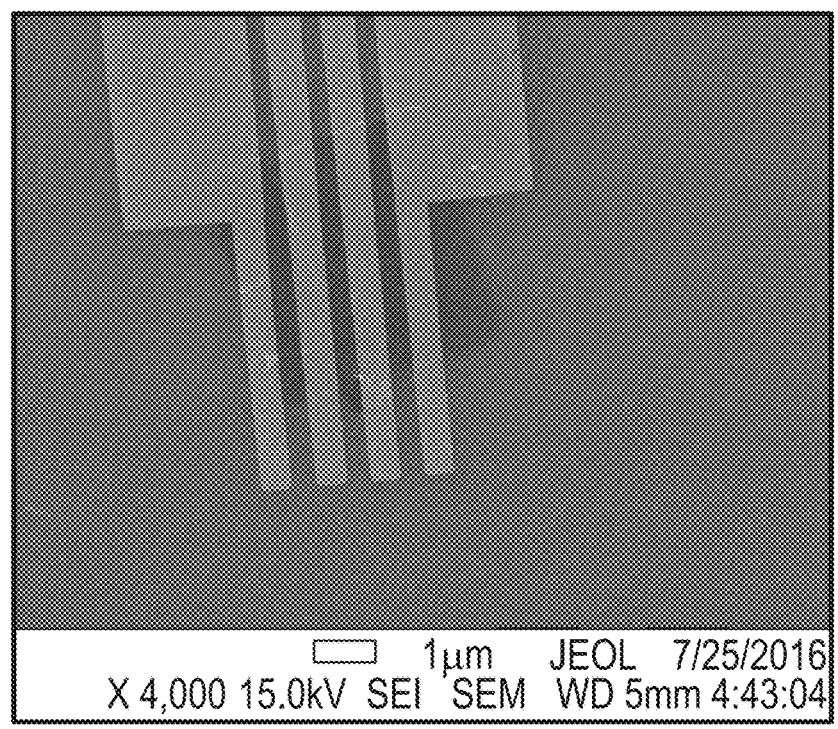
FIG. 5(A) depicts a photomicrograph of a field effect transistor manufactured by the method disclosed herein.
Figure 5B:
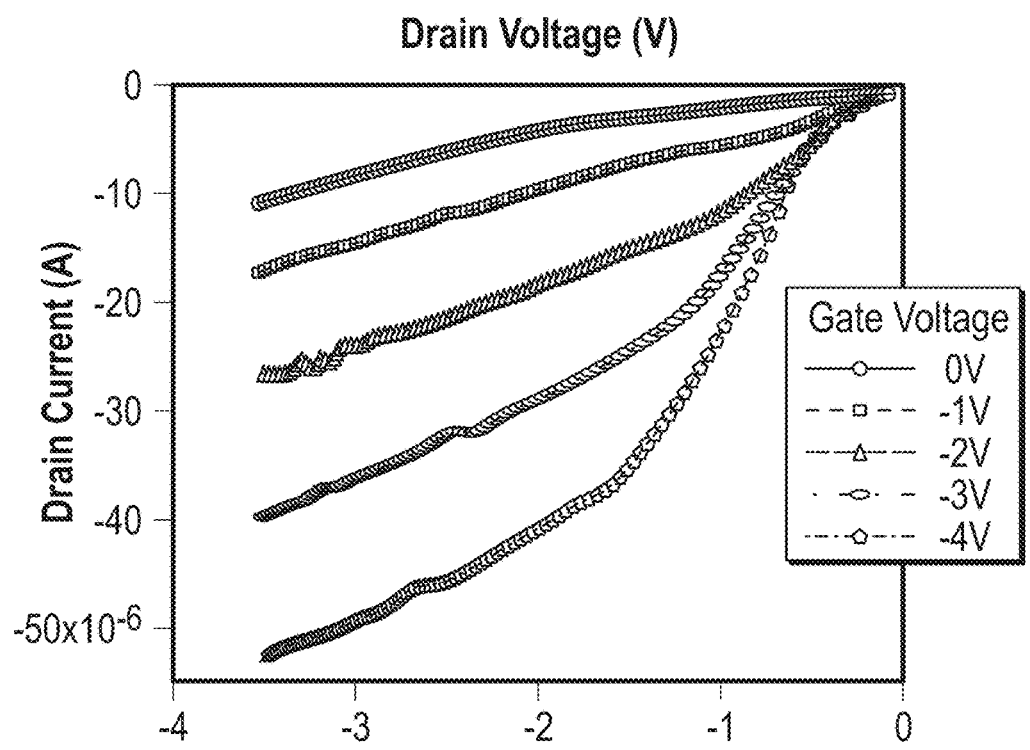
FIG. 5(B) depicts a graph that shows performance of the FET of the FIG. 5(A).

The FIG. 5(A) shows a micrograph of field effect transistor manufactured using a black phosphorus exfoliatable material. The graph in the FIG. 5(B) depicts the drain current versus voltage for the field effect transistor of the FIG. 5(A).

As seen from the example, the method may be used to produce a wide variety of different geometries in an array. Each layer may have a thickness of a few angstroms to several nanometers.

An article manufactured using this method may have disposed on its surface a layer of an exfoliatable material where the layer has a thickness of 3 Angstroms (atomic layer) to 100 nanometers, preferably 10 Angstroms to 50 nanometers, and more preferably 20 Angstroms to 10 nanometers.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, singular forms like "a," or "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The features of the system and method have been disclosed, and further variations will be apparent to persons skilled in the art. All such variations are considered to be within the scope of the appended claims. Reference should be made to the appended claims, rather than the foregoing specification, as indicating the true scope of the disclosed method.

The functions and process steps disclosed herein may be performed automatically or wholly or partially in response to user command. An activity (including a step) performed automatically is performed in response to executable instruction or device operation without user direct initiation of the activity.

The disclosed systems and processes are not exclusive. Other systems and processes may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The processes and applications may, in alternative embodiments, be located on one or more (e.g., distributed) processing devices accessing a network linking the elements of the disclosed system. Further, any of the functions and steps provided in this disclosure may be implemented in hardware, software or a combination of both and may reside on one or more processing devices located at any location of a network linking the elements the disclosed system or another linked network, including the Internet.

It is to be noted that all ranges detailed herein include the endpoints. Numerical values from different ranges are combinable.

The transition term comprising encompasses the transition terms "consisting of" and "consisting essentially of".

The term "and/or" includes both "and" as well as "or". For example, "A and/or B" is interpreted to be A, B, or A and B.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A method comprising:
   patterning a two-dimensional exfoliatable material using a first photoresist in a manner such that a portion of the first photoresist remains in contact with the two-dimensional exfoliatable material after the patterning;
   patterning the two-dimensional exfoliatable material using a second photoresist in a manner such that a portion of the second photoresist remains in contact with the two-dimensional exfoliatable material after the patterning;
   disposing a polymer layer on the two-dimensional exfoliatable material to form a printing block;
   contacting a substrate with the printing block; and
   removing the polymer layer, the first photoresist and the second photoresist from the printing block to leave behind the patterned exfoliatable material on the substrate.

2. The method of claim 1, where the two-dimensional exfoliatable material comprises graphene, graphite, molybdenum disulfide, graphite intercalation compounds, clays, black phosphorus, or a combination thereof.

3. The method of claim 1, where the first photoresist is a polymer that is a thermoplastic polymer or is a crosslinked polymer.

4. The method of claim 3, where the crosslinked polymer is obtained by crosslinking an acrylate or a silane.

5. The method of claim 3, where the thermoplastic polymer is a polymethylmethacrylate.

6. The method of claim 1, where the patterning of the exfoliatable material using a photoresist is accomplished via e-beam lithography and reactive ion etching.

7. The method of claim 1, where the polymer layer comprises a polyvinylalcohol.

8. The method of claim 1, where the disposing of the polymer layer on the exfoliatable material to form a printing block is accomplished via spin casting.

9. The method of claim 1, where the exfoliatable material has a cross-sectional area measured parallel to a substrate of up to $10^6$ square micrometers and a thicknesses of at least 5 nanometers.

10. The method of claim 1, wherein the removing of the polymer layer, the first photoresist and the second photoresist from the printing block are accomplished via dissolution and/or degradation.

11. An article comprising:
    a patterned exfoliatable material; wherein the patterned two-dimensional exfoliatable material is obtained by a method comprising:
       patterning a two-dimensional exfoliatable material using a first photoresist in a manner such that a portion of the photoresist remains in contact with the two-dimensional exfoliatable material after the patterning;
       patterning the two-dimensional exfoliatable material using a second photoresist in a manner such that a portion of the second photoresist remains in contact with the two-dimensional exfoliatable material after the patterning;
       disposing a polymer layer on the two-dimensional exfoliatable material to form a printing block;
       contacting a substrate with the printing block; and
       removing the polymer layer, the first photoresist and the second photoresist from the printing block to leave behind the patterned exfoliatable material on the substrate.

* * * * *